(12) United States Patent
Miettinen

(10) Patent No.: US 6,229,356 B1
(45) Date of Patent: May 8, 2001

(54) STABILIZED GATE DRIVERS

(75) Inventor: Erkki Miettinen, Helsinki (FI)

(73) Assignee: ABB Industry Oy (FI)

( * ) Notice: Subject to any disclaimer, the term of this patent is extended or adjusted under 35 U.S.C. 154(b) by 0 days.

(21) Appl. No.: 09/522,077

(22) Filed: Mar. 9, 2000

(30) Foreign Application Priority Data

Mar. 10, 1999 (FI) ....................................................... 990523

(51) Int. Cl.$^7$ .................................................... H03B 1/00
(52) U.S. Cl. .......................... 327/108; 327/108; 327/109; 327/304
(58) Field of Search .................................... 327/108, 109, 327/190, 191, 303, 304, 374, 432, 433, 434, 442, 125, 126, 130; 323/901; 307/412, 414, 415, 417; 363/21, 26, 98, 134

(56) References Cited

U.S. PATENT DOCUMENTS

| | | | |
|---|---|---|---|
| 4,375,701 | * 3/1983 | Hanson | 307/23 |
| 5,224,026 | * 6/1993 | Okayama | 363/21 |
| 5,514,921 | * 5/1996 | Steigerwald | 327/108 |
| 5,675,244 | * 10/1997 | Piton | 323/901 |
| 5,684,681 | * 11/1997 | Huh | 323/26 |
| 6,128,203 | * 10/2000 | Canizales | 363/21 |

\* cited by examiner

Primary Examiner—Kenneth B. Wells
Assistant Examiner—Paul Dinh
(74) Attorney, Agent, or Firm—Dykema Gossett PLLC

(57) ABSTRACT

A stabilized gate driver which comprises a current source transformer (T) which comprises a primary and a secondary coil, and a gate driver unit (GD) which includes a positive auxiliary voltage input (Va+) and a negative auxiliary voltage input (Va−). The gate driver also comprises a diode (D) the anode of which is connected to the positive pole of the secondary coil of the current source transformer (T), a zener diode (Z) the cathode of which is connected to the cathode of the diode (D), resistance (R) whose one pole is connected to the anode of the zener diode (Z) and the other pole to the negative pole of the secondary coil of the current source transformer (T), a first semiconductor switch (T1) the control electrode (B) of which is connected to the point between the zener diode and the resistance, and the collector of which is connected to the cathode of the zener diode, a second semiconductor switch (T2) the control electrode (B) of which is connected to the point between the zener diode and the resistance and the collector of which is connected to the negative pole of the secondary coil of the current source transformer (T) and the emitter to the emitter of the first semiconductor switch (T1), a first capacitance (C1) the first pole of which is connected to the collector of the first semiconductor switch (T1) and the second pole to the emitter of the second semiconductor switch (T1), the first pole of the capacitance (C1) forming a positive voltage input (V+) which is connected to the positive auxiliary voltage input (Va+) of the gate driver unit (GD), and a second capacitance (C2) the first pole of which is connected to the emitter of the second semiconductor switch (T2) and the second pole to the collector of the second semiconductor switch (T2), the second pole of the capacitance (C2) forming a negative voltage input (V−) which is connected to the negative auxiliary voltage input (Va−) of the gate driver unit (GD), in which case a point between the capacitances (C1, C2) forms a zero potential (Com).

3 Claims, 1 Drawing Sheet

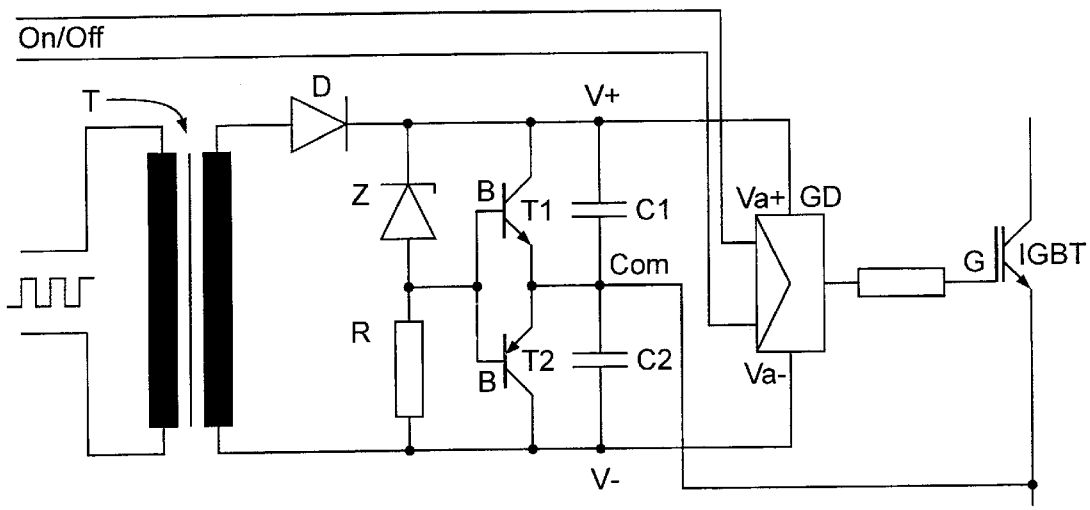

STABILIZED GATE DRIVERS

BACKGROUND OF THE INVENTION

This invention relates to a stabilized gate driver which comprises a current source transformer which comprises a primary coil and a secondary coil, and a gate driver unit which comprises a positive auxiliary voltage input and a negative auxiliary voltage input.

When a power semiconductor component, e.g. an IGB transistor, is controlled, it is important to keep the control voltage within certain values. Typically the voltage used for igniting an IGB transistor should not be lower than +13 volts. If the voltage used for controlling the power semiconductor is too low, the power semiconductor will not become completely saturated, which causes additional conducting losses in the power semiconductor. On the other hand, if the gate voltage exceeds +15 volts, the possible short-circuit current increases so much that it is no longer safe to cut it off quickly.

Considering the disturbance tolerance, the gate of the IGBT to be turned off should be rendered to the negative potential with respect to the emitter. This allows to prevent unintentional ignition of the power semiconductor caused by changes in the potential. A suitable range for turning the IGBT off is from about −5 to −15 volts. The turn-off voltage may vary within a wider range than the ignition voltage without interfering with the function of the power semiconductor.

Earlier voltages for controlling the power semiconductor have been generated with a current source transformer the secondary coil of which comprises a middle output. This way we obtain a bilateral symmetric voltage which does not, however, satisfy all the requirements set for controlling the power semiconductor. Since the voltage feeding the current source transformer has not been stabilized, the voltage may often vary too much, which is disadvantageous particularly on the positive side. Furthermore, this renders the structure of the transformer comprising a middle output unnecessarily complicated, which directly affects the costs of the solution in question.

BRIEF DESCRIPTION OF THE INVENTION

The object of the present invention is to provide a stabilized gate driver which eliminates the above-mentioned drawbacks and enables controlling of power semiconductors in a reliable manner. This object is achieved with a gate driver according to the invention which is characterized in that the gate driver also comprises a diode the anode of which is connected to the positive pole of the secondary coil of the current source transformer, a zener diode the cathode of which is connected to the cathode of the diode, resistance whose one pole is connected to the anode of the zener diode and the other pole to the negative pole of the secondary coil of the current source transformer, a first semiconductor switch the control electrode of which is connected to the point between the zener diode and the resistance, and the collector of which is connected to the cathode of the zener diode, a second semiconductor switch the control electrode of which is connected to the point between the zener diode and the resistance and the collector of which is connected to the negative pole of the secondary coil of the current source transformer and the emitter to the emitter of the first semiconductor switch, a first capacitance the first pole of which is connected to the collector of the first semiconductor switch and the second pole to the emitter of the second semiconductor switch, the first pole of the capacitance forming a positive voltage input which is connected to the positive auxiliary voltage input of the gate driver unit, and a second capacitance the first pole of which is connected to the emitter of the second semiconductor switch and the second pole to the collector of the second semiconductor switch, the second pole of the capacitance forming a negative voltage input which is connected to the negative auxiliary voltage input of the gate driver unit, in which case the point between the capacitances forms the zero potential between the positive and the negative auxiliary voltage input.

The invention is based on the idea that the gate driver can be made to function reliably by stabilizing the auxiliary voltages to be supplied to the gate driver unit which allows to generate a bilateral voltage the positive voltage output of which can be kept within the desired limits for igniting the power semiconductor reliably and keeping it in the line state. The positive voltage supply is stabilized using a simple voltage division connection combined with a current buffer. An advantage of the gate driver according to the invention is that the positive auxiliary voltage can always be kept within the desired voltage limits regardless of the changes in the output voltage of the current source transformer. Changes in the output voltage of the current source transformer affect only the magnitude of the negative power supply of the gate driver according to the invention, for which a wider range of variation is allowed.

BRIEF DESCRIPTION OF THE DRAWINGS

The invention will be described in greater detail by means of preferred embodiments with reference to the accompanying drawing in which the FIGURE is a circuit diagram illustrating a gate driver according to the invention.

DETAILED DESCRIPTION OF THE INVENTION

According to the FIGURE, stabilized voltage is supplied to a gate driver unit GD in a stabilized gate driver of the invention. The output of the gate driver unit is connected to the gate G of the power semiconductor IGBT to be controlled. The purpose of the gate driver unit and the gate driver is to generate a turn-on voltage which is positive with respect to the emitter and negative turn-off voltage for the gate of the component to be controlled. For the gate driver unit GD and the power semiconductor to be controlled to function appropriately, the positive and negative auxiliary voltages to be supplied to the positive and negative auxiliary voltage inputs Va+, Va− of the gate driver unit should be within certain limits. In typical cases the current source transformer T of the gate driver receives its supply from a voltage source the output of which consists of high-frequency rectangular waves. The voltage of such rectangular waves may vary even ±10%. Furthermore, voltages losses of various amounts occur in the current source transformer and in its controller. Because of these factors, the positive base voltage supplied by the gate driver may vary from +12 to +18 volts without stabilization.

As shown in the FIGURE, the stabilized gate driver according to the invention consists of a current source transformer T in which the positive pole of the secondary coil is connected to the anode of a diode D. The primary coil of the current source transformer receives rectangular voltage in its input as described in the FIGURE. The purpose of the diode D is to rectify the pulse-like voltage of the primary coil and let the current pass only in the forward direction of the diode.

According to the invention, the cathode of a zener diode Z is connected to the cathode of the diode D and resistance R is connected to the anode of the zener diode. One pole of the resistance is connected to the negative pole of the secondary coil in the current source transformer. As is wellknown, the zener diode is a component which prevents the current from passing from the cathode to the anode when the voltage over the component is lower than a predetermined limit. When the voltage exceeds this limit, the current can pass through the component without restrictions. Thanks to this feature, the zener diode can be used for limiting the magnitude of voltage.

According to the invention, a series connection of two semiconductor switches T1, T2 is connected in parallel with the series connection of the diode D and the resistance R as shown in the FIGURE. In the embodiment illustrated in the FIGURE the semiconductor switches are NPN and PNP transistors. The collector of the semiconductor switch T1 is connected to the cathode of the zener diode Z and the control electrode B is connected to the point between the zener diode Z and the resistance R. The control electrode B of the second semiconductor switch T2 is connected to the same point with the control electrode of the first semiconductor switch. In addition, the emitter of the second semiconductor is connected to the emitter of the first semiconductor switch and the collector is connected to the negative pole of the secondary coil in the current source transformer T.

The connection according to the invention also comprises a first and a second capacitance C1, C2 which are connected in series as shown in the FIGURE. The series connection is connected in parallel with the series connection of the semiconductor switches so that the first pole of the capacitance C1 is connected to the collector of the first semiconductor switch T1 and the second pole is connected to the emitter of the same semiconductor switch. The second capacitance C2 is connected between the collector and the emitter of the second semiconductor switch T2. The pole connected to the collector of the first semiconductor switch T1 of the capacitance C1 forms the positive voltage supply V+ of the gate driver according to the invention. The negative voltage supply is formed by the pole which is connected to the collector of the second semiconductor switch of the capacitance C2 and is also the negative pole of the secondary coil in the current source transformer T. The point between the capacitances C1, C2 provides the zero potential Com between the positive and the negative voltage supply of the gate driver according to the invention.

In the gate driver according to the invention voltage is stabilized by rectifying the secondary voltage obtained from the current source transformer T to provide it with a value which is approximately the same as the desired difference between the ignition voltage and the turnoff voltage, which is typically 24 volts. This voltage is rendered bilateral by dividing the voltage into a positive and a negative part so that the positive part is stabilized and limited to about +15 volts and the negative part consists of the remaining voltage, i.e. −9 volts.

Voltage is divided according to the value of the reference voltage obtained from the zener diode Z and the resistance R by using, according to a preferred embodiment of the invention, a complementary pair consisting of NPN and PNP transistors T1, T2 as a current buffer. This buffered voltage is generated at the zero potential Corn of the gate driver, and according to the FIGURE, the zero potential is connected to the emitter of the power semiconductor IGBT. According to the invention, the positive and the negative power supply V+, V− of the gate driver is connected to the respective auxiliary voltage inputs Va+. Va− of the gate driver unit GD. Thus the gate driver unit GD can provide the gate G of the power semiconductor IGBT to be controlled with a voltage of +15 volts or about −9 volts in relation to the emitter of the power semiconductor. Because of supply voltage tolerances, the voltage of the negative part may vary between −9 to −12 volts, but the variation does not affect the function of the apparatus. The gate driver unit GD included in the gate driver according to the invention is e.g. an optically separated gate driver unit HCNW 3120 produced by Hewlett Packard. The gate driver unit as well as the power semiconductor connected to the gate driver are controlled with the control inputs On/Off of the gate driver unit.

It is seen in the FIGURE that as the voltage V+ of the positive voltage supply tries to rise over +15 volts, current passes from the zener diode Z to the base of the transistor T1, causing a collector current which exceeds the level of the current by the current amplification of the transistor. This collector current prevents the voltage from rising higher. In practice, the statics of the connection depend only on the dynamic resistance of the zener diode Z, which at the above-mentioned voltages is about 20 ohm. If the current amplification of the transistor T1 is 100, the output resistance of the driver according to the invention will be about 0.2 ohm. The above-mentioned value of output resistance is small enough even for use in an IGBT of 100 amperes.

According to a preferred embodiment of the invention, the secondary coil of the current source transformer T comprises two coils with reverse phases. If the gate driver according to the invention is used e.g. in connection with a frequency converter, one of the secondary coils feeds the control circuit of the upper power switch of the output phase in the frequency transformer and the other one feeds the control circuit of the lower power switch. To prevent the direct component caused by the half-wave rectification of the transformer, the secondary coils are connected with each other so that they are at reverse phases. When this arrangement is used, the amount of power received by the control circuit of lower switch via the transformer is on the average the same as that of the power received by the control circuit of the upper switch. Since the coils receive power in turns and at reverse phases, half-wave rectification does not cause problems.

It will be obvious to a person skilled in the art that the inventive concept can be implemented in various ways. This means that the invention and its embodiments are not limited to the examples described above, but may vary within the scope of the claims.

What is claimed is:

1. A stabilized gate driver which comprises
   a current source transformer (T) which comprises a primary and a secondary coil, and
   a gate driver unit (GD) which comprises a positive auxiliary voltage input (Va+) and a negative auxiliary voltage input (Va−), the gate driver also comprising
   a diode (D) the anode of which is connected to the positive pole of the secondary coil of the current source transformer (T),
   a zener diode (Z) the cathode of which is connected to the cathode of the diode (D),
   resistance (R) whose one pole is connected to the anode of the zener diode (Z) and the other pole to the negative pole of the secondary coil of the current source transformer (T),
   a first semiconductor switch (T1) the control electrode (B) of which is connected to the point between the zener diode and the resistance, and the collector of which is connected to the cathode of the zener diode, a second semiconductor switch (T2) the control electrode (B) of which is connected to the point between the zener diode and the resistance and the collector of which is connected to the negative pole of the secondary coil of the current source transformer (T) and the emitter to the emitter of the first semiconductor switch (T1), a first capacitance (C1) the first pole of which is connected to the collector of the first semiconductor switch (T1) and the second pole to the emitter of the second semiconductor switch (T1), the first pole of the capacitance (C1) forming a positive voltage input (V+) which is connected to the positive auxiliary voltage input (Va+) of the gate driver unit (GD), and a second capacitance (C2) the first pole of which is connected to the emitter of the second semiconductor switch (T2) and the second pole to the collector of the second semiconductor switch (T2), the second pole of the capacitance (C2) forming a negative voltage input (V−) which is connected to the negative auxiliary voltage input (Va−) of the gate driver unit (GD), in which case a point between the capacitances (C1, C2) forms a zero potential.

2. A gate driver according to claim 1, wherein the first semiconductor switch (T1) is an NPN transistor and the second semiconductor switch (T2) is a PNP transistor.

3. A gate driver according to claim 1, wherein the current source transformer (T) comprises two secondary coils with reverse phases.

* * * * *